United States Patent
Demichi et al.

(10) Patent No.: US 9,613,823 B2
(45) Date of Patent: Apr. 4, 2017

(54) ETCHING METHOD AND STORAGE MEDIUM

(71) Applicant: TOKYO ELECTRON LIMITED, Tokyo (JP)

(72) Inventors: Kimihiko Demichi, Nirasaki (JP); Kenshirou Asahi, Nirasaki (JP); Hiroyuki Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/795,363

(22) Filed: Jul. 9, 2015

(65) Prior Publication Data
US 2016/0020115 A1  Jan. 21, 2016

(30) Foreign Application Priority Data
Jul. 18, 2014 (JP) ................................. 2014-147833

(51) Int. Cl.
| | | |
|---|---|---|
| H01L 21/302 | (2006.01) | |
| H01L 21/311 | (2006.01) | |
| H01L 21/02 | (2006.01) | |

(52) U.S. Cl.
CPC .... H01L 21/31116 (2013.01); H01L 21/0206 (2013.01)

(58) Field of Classification Search
CPC ........... H01L 21/02112; H01L 21/0234; H01L 21/02345; H01L 21/324
USPC ....... 438/424, 435, 706, 735; 216/58, 37, 67
See application file for complete search history.

(56) References Cited

U.S. PATENT DOCUMENTS

| | | | |
|---|---|---|---|
| 6,541,401 B1 | 4/2003 | Herner et al. | |
| 8,070,972 B2 * | 12/2011 | Tsujimoto | H01J 37/32935 156/345.15 |
| 8,778,210 B2 * | 7/2014 | Cooper | C09K 13/08 216/83 |
| 2005/0074948 A1 * | 4/2005 | Ko | H01L 21/76224 438/424 |
| 2006/0207968 A1 * | 9/2006 | Mumbauer | B81C 1/00595 216/58 |
| 2013/0023094 A1 | 1/2013 | Yeh et al. | |
| 2014/0357085 A1 * | 12/2014 | Moriya | H01L 21/306 438/706 |

FOREIGN PATENT DOCUMENTS

| | | |
|---|---|---|
| JP | 2005-039185 A | 2/2005 |
| JP | 2008-160000 A | 7/2008 |

* cited by examiner

*Primary Examiner* — Duy Deo
*Assistant Examiner* — Maki Angadi
(74) *Attorney, Agent, or Firm* — Nath, Goldberg & Meyer; Jerald L. Meyer (57) ABSTRACT

An etching method includes disposing a target substrate within a chamber. The target substrate has a first silicon oxide film formed on a surface of the target substrate by a chemical vapor deposition method or an atomic layer deposition method, a second silicon oxide film that includes a thermally-oxidized film and a silicon nitride film. The second silicon oxide film and the silicon nitride are formed adjacent to the first silicon oxide film. The etching method further includes supplying an HF gas and an alcohol gas or water vapor into the chamber to selectively etch the first silicon oxide film with respect to the second silicon oxide film and the silicon nitride film.

10 Claims, 8 Drawing Sheets

Etching amount

FIG. 5B

Etching selection ratio

| Etching time [sec] | Etching selection ratio | | | |
|---|---|---|---|---|
| | BSG/ ALD-SiN | ALD-SiO₂/ ALD-SiN | BSG/ Th-SiO₂ | ALD-SiO₂/ Th-SiO₂ |
| 90 | 72.9 | 74.3 | 85.0 | 86.7 |
| 120 | 75.0 | 76.3 | 80.0 | 81.3 |
| 180 | 50.0 | 65.0 | 50.0 | 65.0 |

FIG. 8

ETCHING METHOD AND STORAGE MEDIUM

CROSS-REFERENCE TO RELATED APPLICATION

This application claims the benefit of Japanese Patent Application No. 2014-147833, filed on Jul. 18, 2014, in the Japan Patent Office, the disclosure of which is incorporated herein in its entirety by reference.

TECHNICAL FIELD

The present disclosure relates to a method of etching a chemical vapor deposition-based (CVD-based) silicon oxide film and a native oxide film formed on a substrate, and a non-transitory storage medium.

BACKGROUND

In recent years, in a manufacturing process of a semiconductor device, a method called chemical oxide removal (COR) in which chemical etching is performed without generating plasma within a chamber draws attention as a method capable of performing miniaturization etching substituted for plasma etching.

As the COR, there is known a process in which an $SiO_2$ film is etched by allowing a hydrogen fluoride (HF) gas and an ammonia ($NH_3$) gas to be adsorbed to a silicon oxide film ($SiO_2$ film) existing on a surface of the semiconductor wafer as a process target within a chamber held in a vacuum, causing the gases to react with the silicon oxide film to generate ammonium fluorosilicate (($NH_4)_2SiF_6$; AFS), and sublimating the ammonium fluorosilicate by heating the same in a subsequent step.

On the other hand, in a manufacturing process of a semiconductor device, a chemical vapor deposition-based (CVD-based) $SiO_2$ film formed by a chemical vapor deposition (CVD) method or an atomic layer deposition (ALD) method may be used as an $SiO_2$ film that is an etching target. In this case, since there may be a case where the CVD-based $SiO_2$ film adjoins a thermally-oxidized film of $SiO_2$ formed by thermally oxidizing silicon or a silicon nitride (SiN) film, it is required to etch the CVD-based $SiO_2$ film at a high selection ratio with respect to the thermally-oxidized film and the SiN film.

Moreover, a native oxide film is formed on the surface of the semiconductor wafer by natural oxidation of Si-based material and thus it is required to only etch the native oxide film while the thermally-oxidized film or the SiN film existing on the semiconductor wafer is etched as less as possible, so as to remove the native oxide film.

However, when an HF gas and an $NH_3$ gas are used as the etching gas as in the related art, it is difficult to etch the CVD-based $SiO_2$ film or the native oxide film at a sufficient selection ratio with respect to the thermally-oxidized film and the SiN film.

SUMMARY

Some embodiments of the present disclosure provide an etching method capable of etching a CVD-based $SiO_2$ film or a native oxide film at a high selection ratio with respect to a thermally-oxidized film and a SiN film by a chemical method without generating plasma within a chamber, and a non-transitory storage medium.

According to the embodiments of the present invention, there is provided an etching method, including disposing a target substrate within a chamber, the target substrate having a first silicon oxide film formed on a surface of the target substrate by a chemical vapor deposition method or an atomic layer deposition method, a second silicon oxide film that includes a thermally-oxidized film and a silicon nitride film, and the second silicon oxide film and the silicon nitride film being formed adjacent to the first silicon oxide film, and supplying an HF gas and an alcohol gas or water vapor into the chamber to selectively etch the first silicon oxide film with respect to the second silicon oxide film and the silicon nitride film.

According to the embodiments of the present invention, there is provided an etching method, including disposing a target substrate within a chamber, the target substrate having a native oxide film formed on a surface of the target substrate, a thermally-oxidized film and a silicon nitride film, and supplying an HF gas and an alcohol gas or water vapor into the chamber to selectively etch and remove the native oxide film with respect to the thermally-oxidized film and the silicon nitride film.

According to the embodiments of the present invention, there is provided a non-transitory storage medium having a program that operates on a computer and controls an etching apparatus stored therein, wherein the program, when executed, causes the computer to control the etching apparatus so as to perform the above-mentioned methods.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5A and FIG. 5B are views for comparison showing the etching properties of an ALD-$SiO_2$ film, a Th—$SiO_2$ film and an ALD-SiN film in the case where an HF gas is alone used as an etching gas and the case where an ethanol gas is added to an HF gas to be used as an etching gas in an experimental example 2, wherein FIG. 5A shows the etching amounts and FIG. 5B shows the etching selection ratio of ALD-$SiO_2$/Th—$SiO_2$ and the etching selection ratio of ALD-$SiO_2$/ALD-SiN.

FIG. 6A and FIG. 6B are views showing flow rate dependency of an ethanol gas in the etching properties of an ALD-$SiO_2$ film, a Th—$SiO_2$ film and an ALD-SiN film in an experimental example 3, wherein FIG. 6A shows the etching amounts and FIG. 6B shows the etching selection ratio of ALD-$SiO_2$/Th—$SiO_2$ and the etching selection ratio of ALD-$SiO_2$/ALD-SiN.

FIG. 7A and FIG. 7B are views showing the etching properties of an ALD-SiO$_2$ film, a Th—SiO$_2$ film, an ALD-SiN film and BSG in an experimental example 4, wherein FIG. 7A shows a relationship between the etching time and the etching amount, and FIG. 7B shows the etching selection ratios of the ALD-SiO$_2$ film and the BSG with respect to the Th—SiO$_2$ film and the ALD-SiN film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One Example of a Processing System Used in Embodiments of the Present Disclosure>

Figure 1:
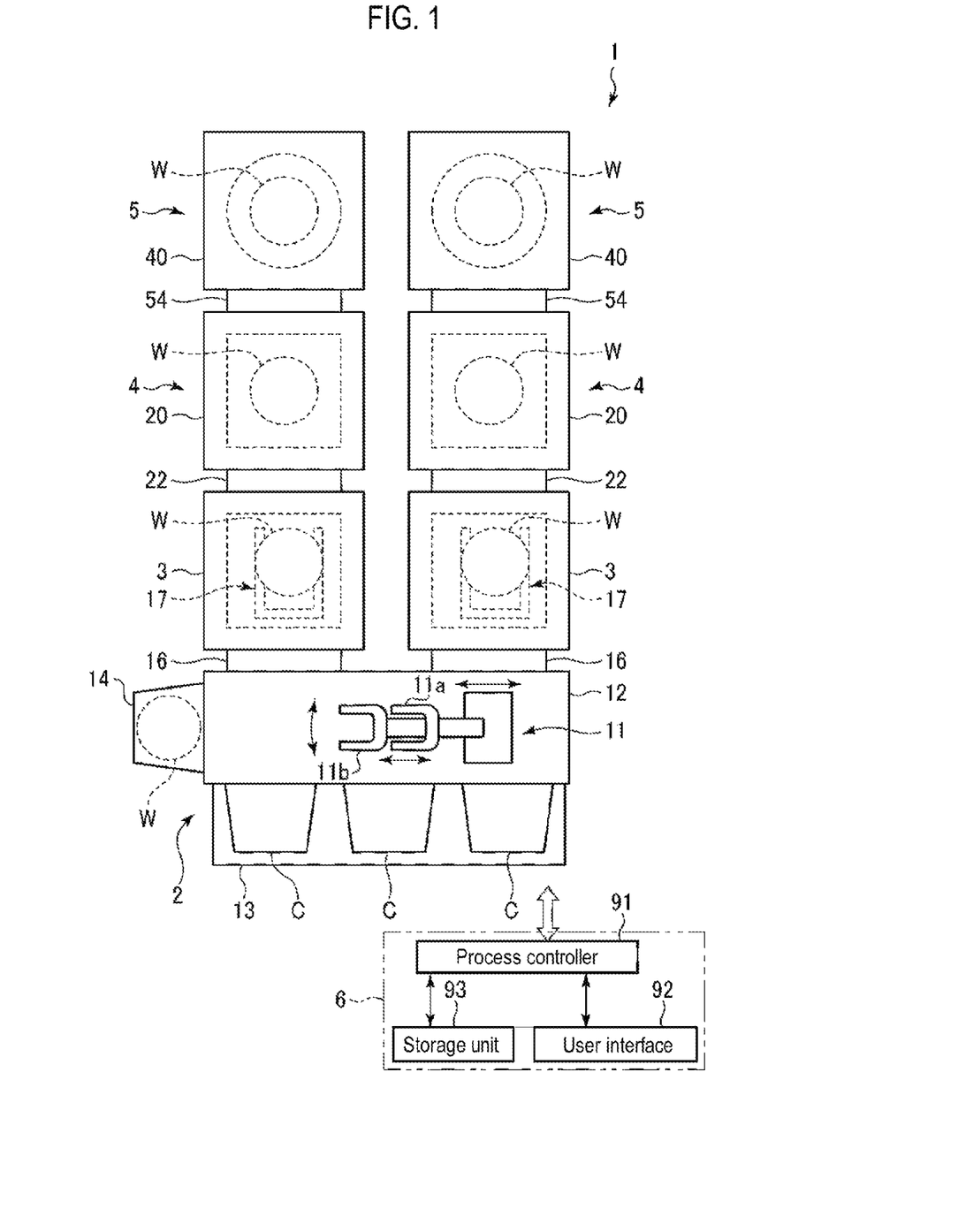
FIG. 1 is a schematic configuration view showing an example of a processing system equipped with an etching apparatus which is used to implement an etching method according to an embodiment of the present disclosure.

FIG. 1 is a schematic configuration view showing one example of a processing system including an etching apparatus according to one embodiment of the present disclosure. The processing system 1 includes a loading/unloading unit 2 configured to load and unload a semiconductor wafer (hereinafter simply referred to as a "wafer") W used as a process target substrate, two load lock chambers (L/L) 3 disposed adjacent to the loading/unloading unit 2, two heat treatment apparatuses 4 disposed adjacent to the load lock chambers 3, respectively, and each of the heat treatment apparatuses 4 configured to perform a heat treatment with respect to the wafer W, two etching apparatuses 5 according to the present embodiment disposed adjacent to the heat treatment apparatuses 4, respectively and each of the etching apparatuses 5 configured to perform etching on the wafer W without generating plasma within a chamber, and a control unit 6.

The loading/unloading unit 2 includes a transfer chamber (L/M) 12 in which a first wafer transfer mechanism 11 for transferring a wafer W is installed. The first wafer transfer mechanism 11 includes two transfer arms 11a and 11b configured to hold the wafer W in a substantially horizontal posture. A loading table 13 is installed at one side of the transfer chamber 12 in a longitudinal direction. For example, three carriers C capable of accommodating a plurality of arranged wafers W can be connected to the loading table 13. Furthermore, an orienter 14 configured to perform a position alignment by optically finding an eccentricity amount through rotation of the wafer W is installed adjacent to the transfer chamber 12.

In the loading/unloading unit 2, the wafer W is transferred to a desired position such that the wafer W is moved straightforward in a substantially horizontal plane or moved up and down by the operation of the first wafer transfer mechanism 11 while being held by each of the transfer arms 11a and 11b. The wafer W is loaded into or unloaded from the carriers C on the loading table 13, the orienter 14 or the load lock chambers 3 by advance or retreat movements of the transfer arms 11a and 11b.

Each of the load lock chambers 3 is connected to the transfer chamber 12 via a gate valve 16 interposed between the load lock chamber 3 and the transfer chamber 12. A second wafer transfer mechanism 17 for transferring the wafer W is installed within each of the load lock chambers 3. Each of the load lock chambers 3 is configured such that it can be vacuumized to a predetermined vacuum degree.

The second wafer transfer mechanism 17 has a multi-joint arm structure and includes a pick configured to hold the wafer W in a substantially horizontal posture. In the second wafer transfer mechanism 17, the pick is positioned within the load lock chamber 3 when the multi-joint arm is retracted. When the multi-joint arm is extended, the pick can reach the heat treatment apparatus 4. When further extending the multi-joint arm, the pick can reach the etching apparatus 5. This makes it possible to transfer the wafer W between the load lock chamber 3, the heat treatment apparatus 4 and the etching apparatus 5.

Figure 2:
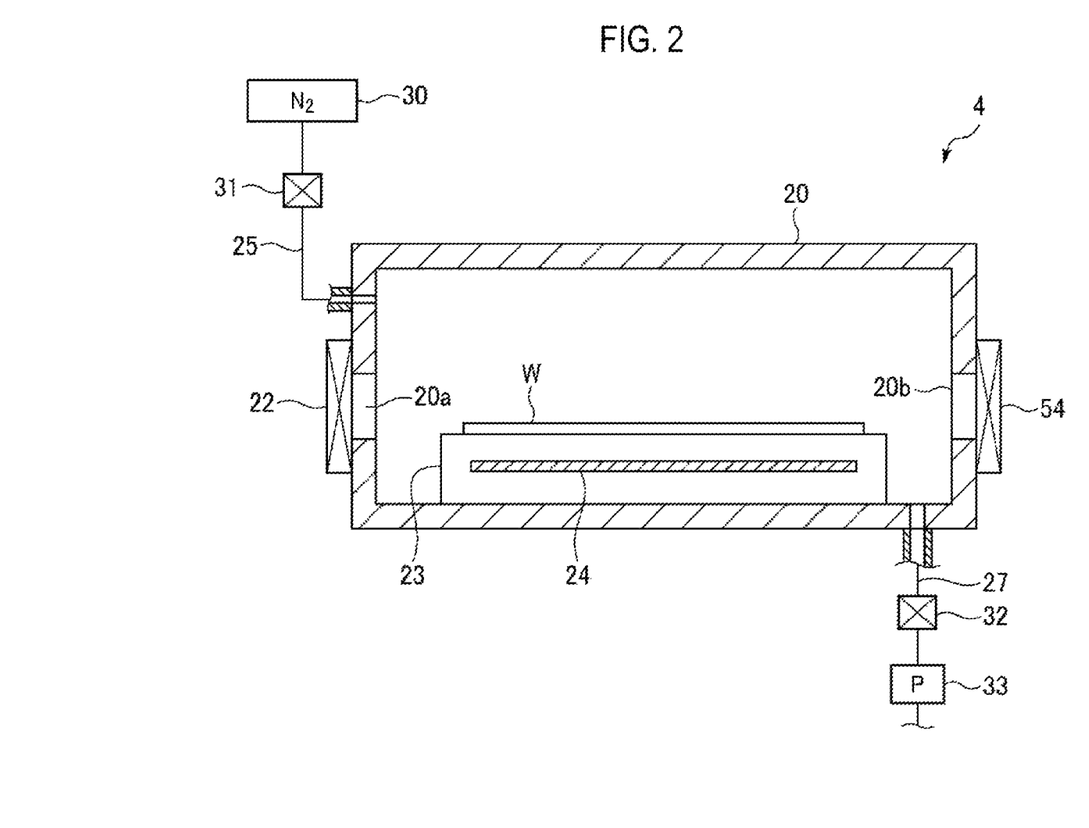
FIG. 2 is a sectional view showing a heat treatment apparatus installed in the processing system shown in FIG. 1.

As shown in FIG. 2, the heat treatment apparatus 4 includes a chamber 20 within which a vacuum environment can be formed and a loading table 23 configured to mount thereon the wafer W in the chamber 20. A heater 24 is embedded in the loading table 23. The wafer W subjected to etching is heated by the heater 24, thereby vaporizing and removing etching residues existing on the wafer W. A loading/unloading gate 20a through which the wafer W is transferred between the heat treatment apparatus 4 and the load lock chamber 3 is formed in the sidewall of the chamber 20 adjoining the load lock chamber 3. The loading/unloading gate 20a can be opened and closed by a gate valve 22. Furthermore, a loading/unloading gate 20b through which the wafer W is transferred between the heat treatment apparatus 4 and the etching apparatus 5 is formed in the sidewall of the chamber 20 adjoining the etching apparatus 5. The loading/unloading gate 20b can be opened and closed by a gate valve 54. A gas supply path 25 is connected to an upper portion of the sidewall of the chamber 20. The gas supply path 25 is connected to an N$_2$ gas supply source 30. An exhaust path 27 connected to a vacuum pump 33 is connected to the bottom wall of the chamber 20. A flow rate regulating valve 31 is installed in the gas supply path 25. A pressure regulating valve 32 is installed in the exhaust path 27. A heat treatment is performed in the chamber 20 in which a N$_2$ gas atmosphere having a predetermined pressure is kept by controlling the flow rate regulating valve 31 and the pressure regulating valve 32. Instead of the N$_2$ gas, it is possible to use an inert gas such as an Ar gas or the like.

The control unit 6 includes a process controller 91 provided with a microprocessor (computer) which controls the respective components of the processing system 1. A user interface 92 which includes a keyboard for enabling an operator to perform a command input operation or the like in order to manage the processing system 1 and a display for visually displaying an operative state of the processing system 1 is connected to the process controller 91. Also connected to the process controller 91 is a storage unit 93 which stores a control program for realizing, under the control of the process controller, various kinds of processes implemented by the processing system 1, for example, the supply of a process gas and the evacuation of the interior of the chamber in each of the etching apparatuses 5 to be described later, a process recipe which is a control program for enabling the respective constituent parts of the processing system 1 to implement specified processes pursuant to process conditions, various kinds of databases, and so forth. The process recipe is stored in a suitable storage medium (not shown) of the storage unit 93. Further, if necessary, an arbitrary recipe is called out from the storage unit 93 and is executed by the process controller 91. Thus, desired processes are implemented in the processing system 1 under the control of the process controller 91.

The etching apparatus 5 according to the present embodiment performs pattern-etching onto a CVD-based $SiO_2$ film or etching a native oxide film to remove the native oxide film using an HF gas, an alcohol gas and the like. The specific configuration thereof will be described later in detail.

A wafer W used in the processing system 1 includes thereon a CVD-based $SiO_2$ film formed by a CVD method or an ALD method or a native oxide film as an etching target, and a thermally-oxidized film and a SiN film formed adjacent to the CVD-based $SiO_2$ film or the native oxide film. A plurality of wafers W of this type is accommodated within a carrier C and is transferred to the processing system 1.

In the processing system 1, one wafer W is transferred from the carrier C of the loading/unloading unit 2 to the load lock chamber 3 by one of the transfer arms 11a and 11b of the first wafer transfer mechanism 11 in a state where an atmosphere-side gate valve 16 opened. The wafer W is delivered to the pick of the second wafer transfer mechanism 17 disposed within the load lock chamber 3.

Thereafter, the atmosphere-side gate valve 16 is closed and the interior of the load lock chamber 3 is evacuated to form a vacuum environment. Subsequently, the gate valve 54 is opened and the pick is extended to the etching apparatus 5, thereby transferring the wafer W to the etching apparatus 5.

Thereafter, the pick is returned to the load lock chamber 3 and the gate valve 54 is closed. After that, an etching process is performed within the etching apparatus 5 in the below-described manner.

After the etching process is completed, the gate valves 22 and 54 are opened and the etched wafer W is transferred to the heat treatment apparatus 4 by the pick of the second wafer transfer mechanism 17. While introducing an $N_2$ gas into the chamber 20, the wafer W mounted on the loading table 23 is heated by the heater 24, thereby thermally removing an etching residue or the like.

After the heat treatment is completed in the heat treatment apparatus 4, the gate valve 22 is opened and the etched wafer W mounted on the loading table 23 is returned to the load lock chamber 3 by the pick of the second wafer transfer mechanism 17. The etched wafer W is returned to the carrier C by one of the transfer arms 11a and 11b of the first wafer transfer mechanism 11. Thus, a process for one wafer is completed.

Since a reaction product as in the COR according to the related art is not generated in the etching apparatus 5 of the present embodiment, the heat treatment apparatuses 4 are not essential. If the heat treatment apparatuses are not used, the wafer W subjected to the etching process may be retreated to the load lock chamber 3 by the pick of the second wafer transfer mechanism 17 and may be returned to the carrier C by one of the transfer arms 11a and 11b of the first wafer transfer mechanism 11.

<Configuration of Etching Apparatus>

Figure 3:
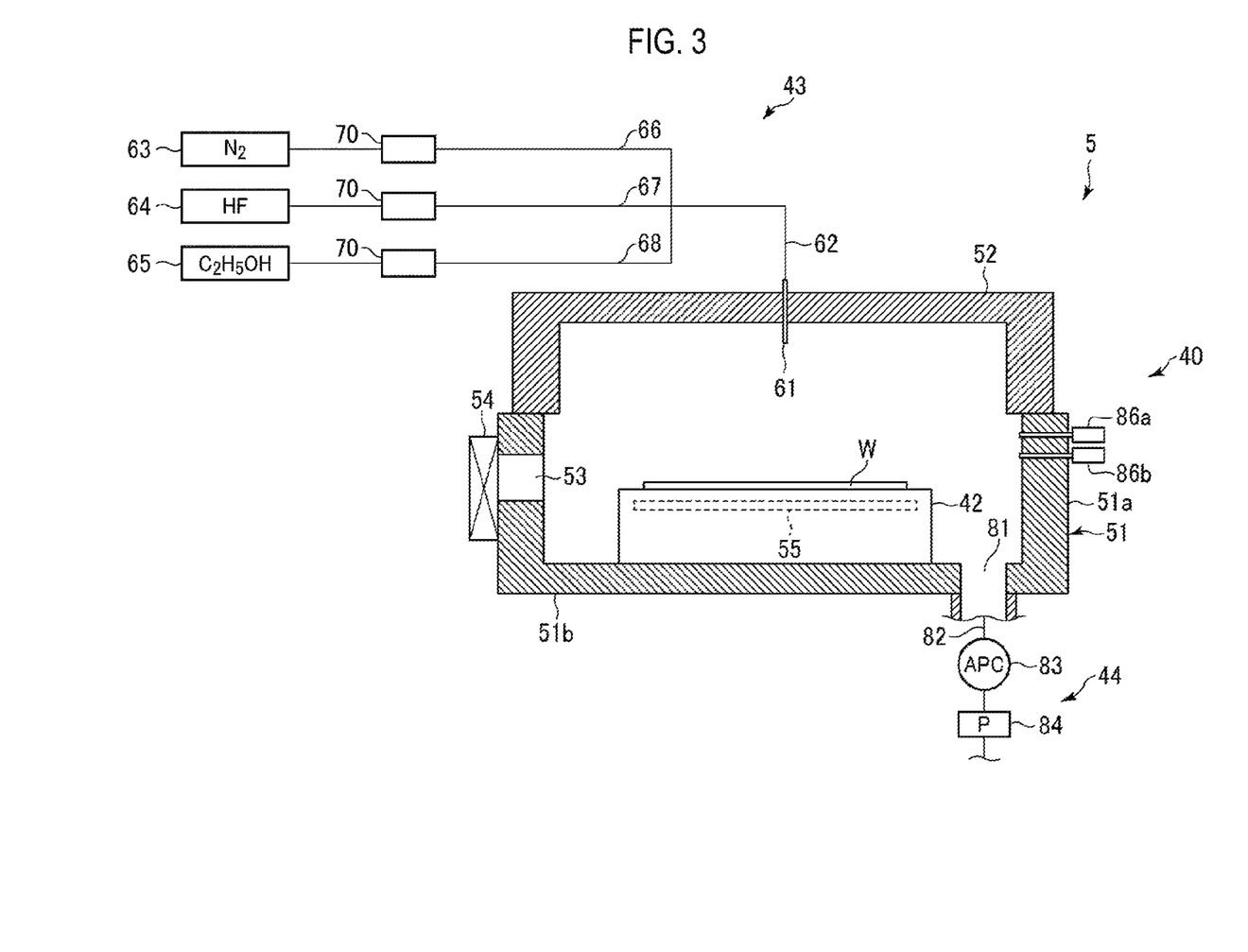
FIG. 3 is a sectional view showing the etching apparatus installed in the processing system shown in FIG. 1.

Next, the etching apparatus 5 according to the present embodiment will be described in detail. FIG. 3 is a sectional view showing the etching apparatus according to the present embodiment. As shown in FIG. 3, the etching apparatus 5 includes a chamber 40 having a sealed structure. A loading table 42 for mounting thereon a wafer W in a substantially horizontal posture is installed within the chamber 40. The etching apparatus 5 further includes a gas supply mechanism 43 configured to supply an etching gas to the chamber 40 and an evacuation mechanism 44 configured to evacuate the interior of the chamber 40.

The chamber 40 is configured by a chamber body 51 and a cover portion 52. The chamber body 51 includes a substantially cylindrical sidewall portion 51a and a bottom portion 51b. The upper portion of the chamber body 51 is opened and is closed by the cover portion 52. The sidewall portion 51a and the cover portion 52 are sealed by a seal member (not shown), thereby securing the air-tightness of the interior of the chamber 40. A gas introduction nozzle 61 is inserted through the top wall of the cover portion 52 so as to extend from above toward the interior of the chamber 40.

A loading/unloading gate 53 through which the wafer W is loaded and unloaded between the chamber 40 of the etching apparatus 5 and the chamber 20 of the heat treatment apparatus 4 is formed in the sidewall portion 51a. The loading/unloading gate 53 can be opened and closed by a gate valve 54.

The loading table 42 has a substantially circular shape when seen in a plan view and is fixed to the bottom portion 51b of the chamber 40. A temperature controller 55 for controlling the temperature of the loading table 42 is installed within the loading table 42. The temperature controller 55 includes a pipe line through which a temperature controlling medium (e.g., water, etc.) circulates. Through the heat exchange with the temperature controlling medium flowing through the pipe line, the temperature of the loading table 42 is controlled and hence the temperature of the wafer W mounted on the loading table 42 is controlled.

The gas supply mechanism 43 includes a $N_2$ gas supply source 63 which supplies a $N_2$ gas as an inert gas, an HF gas supply source 64 which supplies an HF gas, and an ethanol gas supply source 65 which supplies an ethanol ($C_2H_5OH$) gas as an alcohol gas. Furthermore, the gas supply mechanism 43 includes a first gas supply pipe 66 connected to the $N_2$ gas supply source 63, a second gas supply pipe 67 connected to the HF gas supply source 64, a third gas supply pipe 68 connected to the ethanol gas supply source 65, and a common gas supply pipe 62 to which the first to third gas supply pipes 66 to 68 are connected. The common gas supply pipe 62 is connected to the gas introduction nozzle 61 mentioned above.

Flow rate controllers 70 for performing a flow path opening/closing operation and a flow rate control operation are installed in the first to third gas supply pipes 66 to 68, respectively. The flow rate controller 70 is configured by, e.g., an on/off valve and a mass flow controller.

In the gas supply mechanism 43 configured as mentioned above, the $N_2$ gas, the HF gas and the ethanol gas are supplied from the $N_2$ gas supply source 63, the HF gas supply source 64 and the ethanol gas supply source 65 to the common gas supply pipe 62 through the first to third gas supply pipes 66 to 68. Then, the $N_2$ gas, the HF gas and the ethanol gas are supplied into the chamber 40 via the gas introduction nozzle 61. In addition, a shower plate may be installed in the upper portion of the chamber 40 to supply the aforementioned gases in a shower-like manner through the shower plate.

In the present embodiment, the ethanol gas is used as an example of the alcohol gas. However, alcohol is not limited to ethanol but other kinds of alcohol may be selected. In that case, a gas supply source for supplying the selected alcohol gas may be used in place of the ethanol gas supply source 65. Monovalent alcohol may be used as the alcohol in some embodiments. Further, methanol ($CH_3OH$), propanol ($C_3H_7OH$), and butanol ($C_4H_9OH$) may be suitably used as the monovalent alcohol in addition to ethanol and at least one of them may be used. Propanol has two kinds of structural isomers while butanol has four kinds of structural isomers, whichever may be used. Since it is presumed that an OH group contained in the alcohol contributes to etching, water may be used as a material containing an OH group instead of alcohol. In that case, water vapor may be supplied using a water vapor supply source instead of the ethanol gas supply source 65.

The $N_2$ gas that is an inert gas is used as a dilution gas. As the inert gas, it may be possible to use an Ar gas or both a $N_2$ gas and an Ar gas. Although the $N_2$ gas and the Ar gas are desirable as the inert gas, it may be possible to use inert gases other than the Ar gas, e.g., noble gases such as a He gas and the like. In addition, the inert gas may be used not only as the dilution gas but also as a purge gas that purges the interior of the chamber 40.

The evacuation mechanism 44 includes an exhaust pipe 82 connected to an exhaust port 81 formed in the bottom portion 51b of the chamber 40. The evacuation mechanism 44 further includes an automatic pressure control valve (APC) 83 installed in the exhaust pipe 82 and configured to control the internal pressure of the chamber 40 and a vacuum pump 84 configured to evacuate the interior of the chamber 40.

In the sidewall of the chamber 40, two capacitance manometers 86a and 86b as pressure gauges for measuring the internal pressure of the chamber 40 are installed being inserted into the chamber 40. The capacitance manometer 86a is used for a high pressure while the capacitance manometer 86b is for a low pressure. A temperature sensor (not shown) for detecting the temperature of the wafer W is installed near the wafer W mounted on the loading table 42.

Aluminum is used as the material of the respective components which constitute the etching apparatus 5, such as the chamber 40 and the loading table 42. The aluminum material which constitutes the chamber 40 may be a pure aluminum material or an aluminum material having an anodically oxidized inner surface (the inner surface of the chamber body 51, etc.). On the other hand, the surface of the aluminum material which constitutes the loading table 42 requires a wear resistance. It is therefore desirable that an oxide film ($Al_2O_3$ film) having a high wear resistance is formed on the surface of the aluminum material by anodically oxidizing the aluminum material.

<Etching Method Implemented by Etching Apparatus>

Next, a description will be made on an etching method implemented by the etching apparatus configured as mentioned above.

In this example, while keeping the gate valve 54 opened, the wafer W having the aforementioned configuration, namely the wafer W having a CVD-based $SiO_2$ film as an etching target formed on the surface thereof, a thermally-oxidized film and a SiN film formed adjacent to the CVD-based $SiO_2$ film, or the wafer W having a native oxide film as an etching target formed on the surface thereof, a thermally-oxidized film and a SiN film, is loaded from the loading/unloading gate 53 into the chamber 40 by the pick of the second wafer transfer mechanism 17 disposed within the load lock chamber 3. Then, the wafer W is mounted on the loading table 42. Examples of the CVD-based $SiO_2$ film as an etching target include a film formed by an ALD method using an oxidizing agent and a silane-based gas such as $SiH_4$ or aminosilane as a Si precursor or a BSG film formed by a CVD method using an oxidizing agent, a silane-based gas and a boron-based gas. Of course, examples of the CVD-based $SiO_2$ film may include a film formed using other Si precursors. Furthermore, examples of the SiN film include a film formed by the CVD method or the ALD method. Examples of the Si precursor include dichlorosilane (DCS; $SiCl_2H_2$), hexachlorodisilane (HCD; $Si_2Cl_6$) or the like.

Thereafter, the pick is returned to the load lock chamber 3. The gate valve 54 is closed to keep the interior of the chamber 40 in a sealed state.

Subsequently, if needed, an HF gas and an ethanol gas as an alcohol gas are diluted with an $N_2$ gas as an inert gas, and are introduced into the chamber 40, thereby selectively etching the CVD-based $SiO_2$ film or a native oxide film of the wafer W.

Specifically, the temperature of the loading table 42 is controlled by the temperature controller 55 so as to fall within a predetermined range and the internal pressure of the chamber 40 is regulated to fall within a predetermined range. The $N_2$ gas, the HF gas and the ethanol gas are introduced from the $N_2$ gas supply source 63, the HF gas supply source 64 and the ethanol gas supply source 65 of the gas supply mechanism 43, respectively, into the chamber 40 through the first to third gas supply pipes 66 to 68, the common gas supply pipe 62 and the gas introduction nozzle 61, thereby etching the CVD-based $SiO_2$ film or the native oxide film.

At this time, as described above, other alcohol gases may be used in place of the ethanol gas. Monovalent alcohol may be used as the alcohol. As the monovalent alcohol, it may be possible to suitably use not only the ethanol but also methanol, propanol or butanol. Moreover, water vapor may be used in place of the alcohol gas.

The etching characteristics of a CVD-based $SiO_2$ film and a native oxide film are different from those of a thermally-oxidized film and a SiN film. Namely, when an HF gas and an ethanol gas (or water vapor) suitably diluted with an inert gas, as necessary, are used as etching gases, as in the present embodiment, an etching process to the CVD-based $SiO_2$ film and the native oxide film becomes easy to progress by an OH group of the alcohol gas or water vapor, whereas the OH group hardly contributes to an etching process to the thermally-oxidized film and the SiN film. It is therefore possible to etch the CVD-based $SiO_2$ film and the native oxide film at an extremely high selection ratio with respect to the thermally-oxidized film and the SiN film.

In this etching process, the internal pressure of the chamber 40 may fall within a range from 66.7 to 1333.3 Pa (from 0.5 to 10 Torr⁻) and the temperature of the loading table 42 (approximately the temperature of the wafer) may range from 0 to 30 degrees C. The internal pressure of the chamber 40 may range from 133.3 to 666.7 Pa (from 1.0 to 5.0 Torr⁻) in some embodiments and the temperature of the loading table 42 may range from 0 to 15 degrees C. in some embodiments. The internal pressure of the chamber 40 may range from 266.6 to 533.3 Pa (from 2.0 to 4.0 Torr⁻) in some embodiments and the temperature of the loading table 42 may range from 0 to 10 degrees C. in some embodiments.

The alcohol gas and water vapor, as described above, tend to increase the etching selection ratio of the CVD-based $SiO_2$ film or the native oxide film with respect to the thermally-oxidized film and the SiN film. The volume ratio (flow rate ratio) of the alcohol gas (or water vapor) to the total volume of the HF gas and the alcohol gas (or water vapor) may fall within a range from 3 to 50 volume % and, in some embodiments, within a range of from 5 to 15 volume %. In addition, an inert gas such as an $N_2$ gas may be contained to some degree so as to etch the CVD-based $SiO_2$ film or the native oxide film at a high selection ratio. At this time, the volume ratio (flow rate ratio) of the inert gas to the total volume of the HF gas, the alcohol gas (or water vapor) and the inert gas may be 80 volume % or less and, in some embodiments, within a range from 55 to 75 volume %.

Thus, the CVD-based $SiO_2$ film or the native oxide film can be etched at a high selection ratio with respect to the thermally-oxidized film and the SiN film using the HF gas and the ethanol gas and, if needed, together with the inert gas. If the gas composition or the conditions such as pressure and a temperature are optimized, it may be possible to etch the CVD-based $SiO_2$ film or the native oxide film at an very high etching selection ratio, i.e., the etching selection ratio of the CVD-based $SiO_2$ film or the native oxide is 50 or more and further 100 with respect to the thermally-oxidized film and the etching selection ratio is 50 or more with respect to the SiN film. Moreover, in a case of etching a CVD-based $SiO_2$ film on a wafer having a native oxide film formed on the surface of the wafer, the native oxide film can be also removed at a high selection ratio while etching the CVD-based $SiO_2$ film at a high selection ratio, with respect to the thermally-oxidized film and the SiN film.

After the etching process in the etching apparatus 5 is completed in this way, the gate valve 54 is opened. The etched wafer W mounted on the loading table 42 is unloaded from the chamber 40 by the pick of the second wafer transfer mechanism 17. Consequently, the etching by the etching apparatus 5 is terminated.

EXPERIMENTAL EXAMPLES

Next, a description will be made on experimental examples.

Experimental Example 1

In this experimental example, the etching properties were compared between the case where the HF/$NH_3$ gases of the related art were used as a processing gas and the case where the HF/ethanol gases of the present disclosure were used as a processing gas. An $SiO_2$ film (ALD-$SiO_2$) formed by an ALD method and a thermally-oxidized film (Th—$SiO_2$) were etched using the conventional gas system under the conditions where the volume ratio of an $NH_3$ gas to the total volume of an HF gas and an $NH_3$ gas which constitute the conventional gas system was 56.6 volume %, the gas flow rate of the $N_2$ gas+an Ar gas fell within a range from 500 to 1,000 sccm, the total gas flow rate of the above mentioned gases fell within a range from 1,000 to 2,000 sccm, the temperature of a loading table fell within a range from 100 to 150 degrees C. and the internal pressure of the chamber fell within a range from 2 to 4 Torr. On the other hand, an ALD-$SiO_2$ film, a Th—$SiO_2$ film and SiN film (ALD-SiN) formed by an ALD method were etched using the gas system of the present disclosure under the conditions where the volume ratio of an ethanol gas to the total volume of an HF gas and an ethanol gas (Et-OH) was 10.7 volume %, the gas flow rate of an $N_2$ gas+an Ar gas fell within a range of from 500 to 1,500 sccm, the total gas flow rate of the abovementioned gases fell within a range of from 1,000 to 2,000 sccm, the temperature of the loading table fell within a range of from 0 to 10 degrees C. and the internal pressure of the chamber fell within a range of from 2 to 4 Torr.

Figure 4:
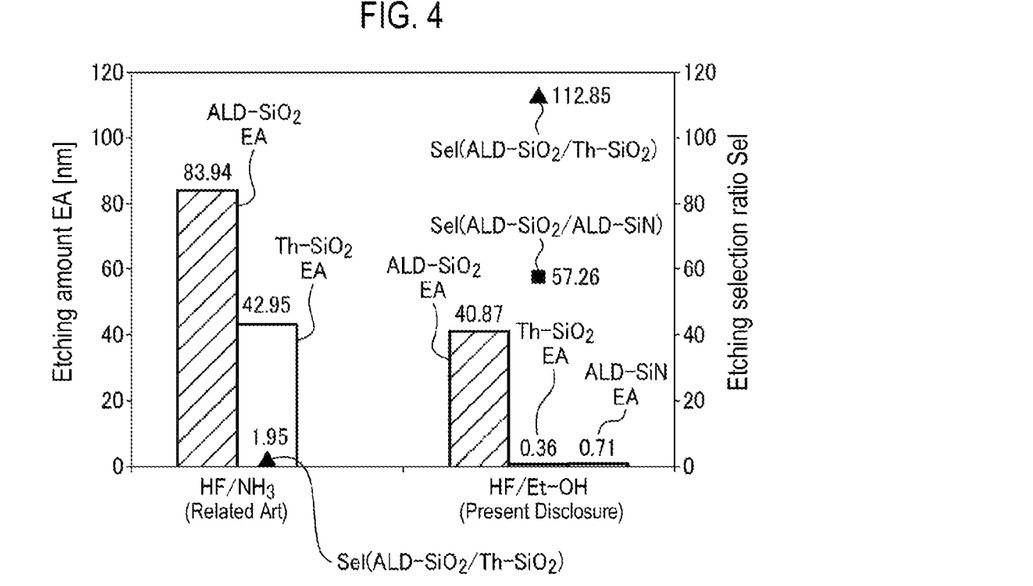
FIG. 4 is a view showing the etching amounts and the etching selection ratio when etching an ALD-$SiO_2$ film, a Th—$SiO_2$ film and an ALD-SiN film by a gas system of the related art and a gas system of the present disclosure in experimental example 1.

At that time, the etching amounts (EA) and the etching selection ratios (Sel) are shown in FIG. 4. As shown in FIG. 4, when the HF/$NH_3$ gases of the related art were used, the ALD-$SiO_2$ film was etched with a high etching amount and the etching amount of the Th—$SiO_2$ film was also high, so that the etching selection ratio (ALD-$SiO_2$/Th—$SiO_2$) of the ALD-$SiO_2$ film with respect to the Th—$SiO_2$ film was a low value of 1.95. On the contrary, when the HF/Et-OH gases of the present disclosure were used, the etching amount of the ALD-$SiO_2$ film was a little lower than that of the case where the HF/$NH_3$ gases were used and the etching amounts of the Th—$SiO_2$ film and the ALD-SiN film were very small. The etching selection ratio (ALD-$SiO_2$/Th—$SiO_2$) of the ALD-$SiO_2$ film with respect to the Th—$SiO_2$ film was 112.85 which is the value exceeding 100 and the etching selection ratio (ALD-$SiO_2$/ALD-SiN) of the ALD-$SiO_2$ film with respect to the ALD-SiN film was 57.26 which is the value exceeding 50.

Experimental Example 2

In this experimental example, the effectiveness of the ethanol gas used in the etching process was confirmed. The etching properties of an ALD-$SiO_2$ film, a Th—$SiO_2$ film and an ALD-SiN film were compared between the case where an HF gas as an etching gas is used alone at a flow rate ranging from 500 to 1,000 sccm and the case where an ethanol gas is added to an HF gas by 4.6 volume % with respect to the total volume of the HF gas and the ethanol gas. In addition, the temperature of the loading table ranged from 0 to 10 degrees C. and the internal pressure of chamber ranged from 0.5 to 1.0 Torr.

Figure 5A:
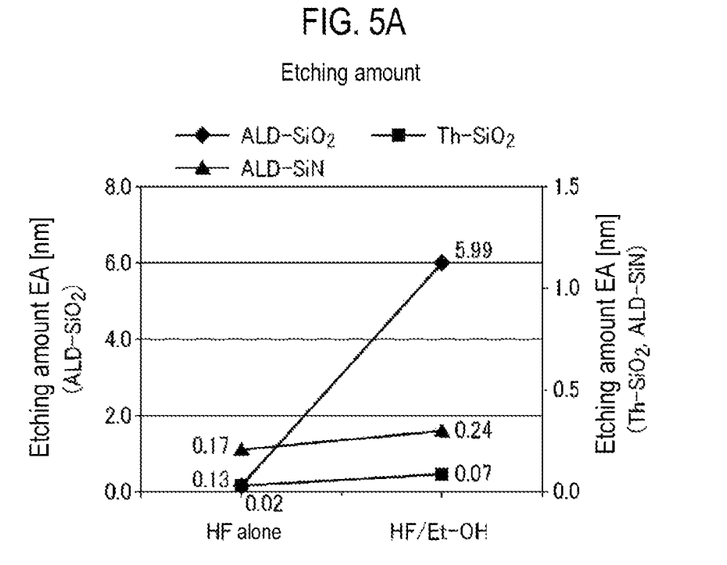
Figure 5B:
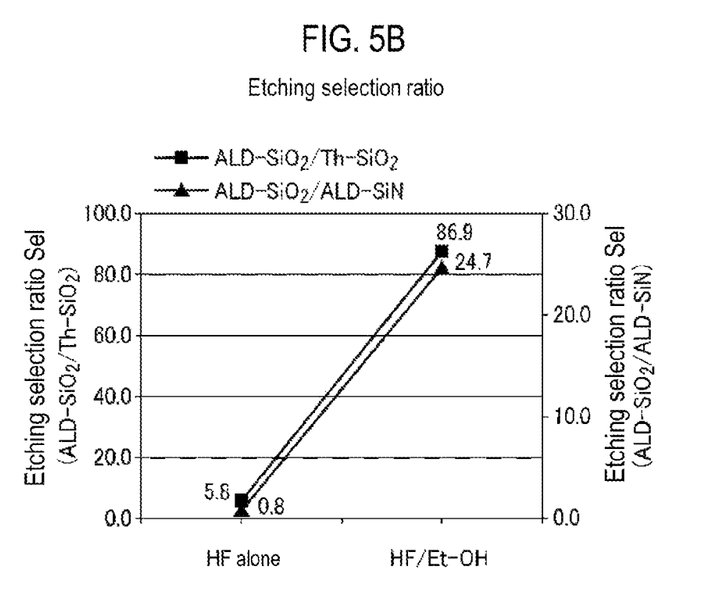

FIG. 5A and FIG. 5B show the etching amounts and the etching selection ratios at that time, respectively. As shown in FIG. 5A and FIG. 5B, in the case of using the HF gas alone and the case of using the HF gas to which an ethanol gas was added, it was confirmed that the etching amounts of the Th—$SiO_2$ film and the ALD-SiN film didn't change much, whereas the etching amount of the ALD-$SiO_2$ film was rapidly increased by the addition of the ethanol gas, and that the etching selection ratio (ALD-$SiO_2$/Th—$SiO_2$) of the ALD-$SiO_2$ film with respect to the Th—$SiO_2$ film and the etching selection ratio (ALD-$SiO_2$/ALD-SiN) of the ALD-$SiO_2$ film with respect to the ALD-SiN film were all significantly increased by the addition of the ethanol gas to the HF gas.

Experimental Example 3

In this experimental example, the flow rate dependency of the ethanol gas used in the etching process was confirmed. The etching properties of an ALD-$SiO_2$ film, a Th—$SiO_2$ film and an ALD-SiN film were observed when the flow rate ratio of an ethanol gas (the flow rate % of an ethanol gas based on the total flow rate of an HF gas+an $NH_3$ gas) was changed within a range from 5 to 12%. In addition, the loading table temperature fell within a range of 0 to 10 degrees C. and the internal pressure of the chamber fell within a range of 2.0 to 3.0 Torr.

Figure 6A:
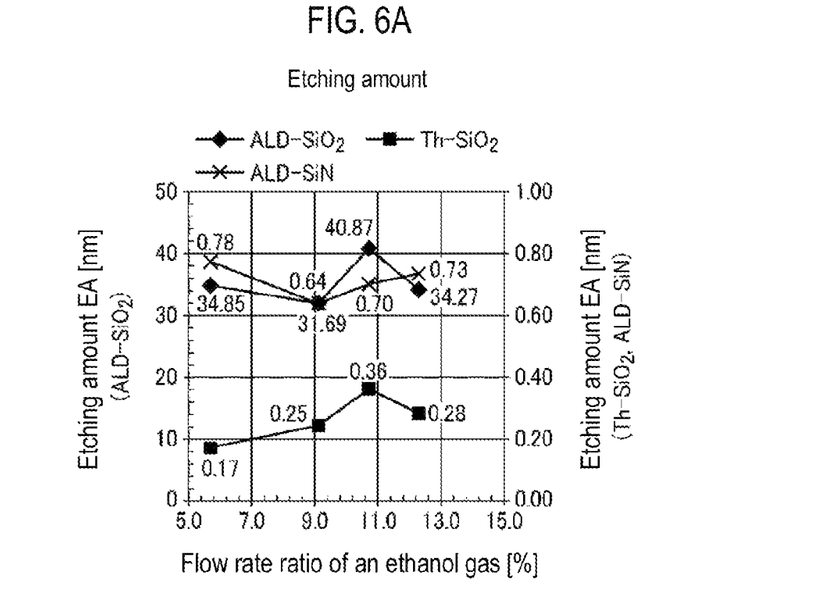
Figure 6B:
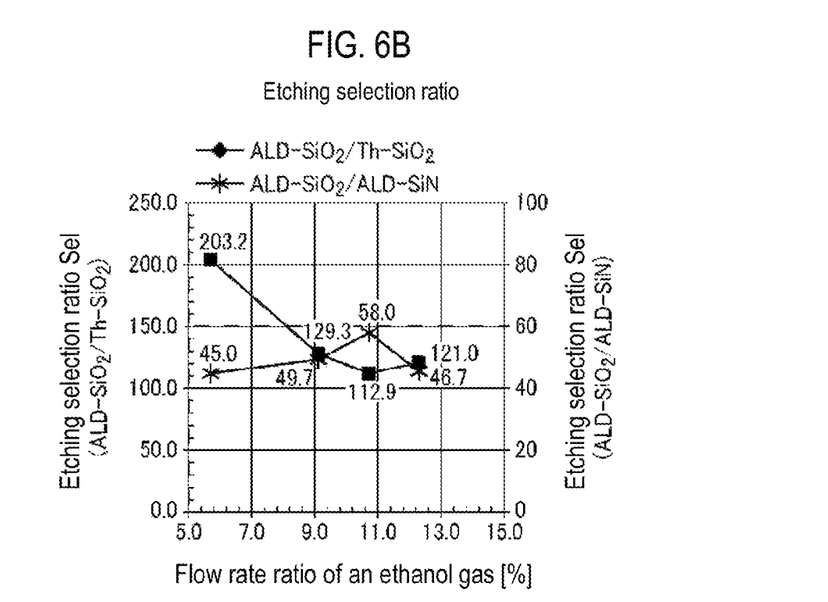

FIG. 6A and FIG. 6B show the etching amounts and the etching selection ratios at that time, respectively. As shown in FIG. 6A and FIG. 6B, it was confirmed that, when the flow rate ratio of the ethanol gas fell within a range from 5 to 12%, the etching amount of the ALD-$SiO_2$ film tends to be high and the etching amounts of the Th—$SiO_2$ film and the ALD-SiN film tend to be low. Further, it was also confirmed that the etching selection ratio (ALD-$SiO_2$/Th—$SiO_2$) of the ALD-$SiO_2$ film with respect to the Th—$SiO_2$ film and the etching selection ratio (ALD-$SiO_2$/ALD-SiN) of the ALD-$SiO_2$ film with respect to the ALD-SiN film were all significantly high. Specifically, under the range from 5 to 12% of the flow rate ratio of the ethanol gas, although the ALD-$SiO_2$/Th—$SiO_2$ selection ratio tends to decrease with an increase of the flow rate ratio of the ethanol gas, the value of the ALD-SiO$_2$/Th—SiO$_2$ selection ratio exceeded 100. On the other hand, the ALD-SiO$_2$/ALD-SiN selection ratio was almost flat against the flow rate ratio of the ethanol gas and the value thereof was near 50.

Experimental Example 4

Figure 7A:
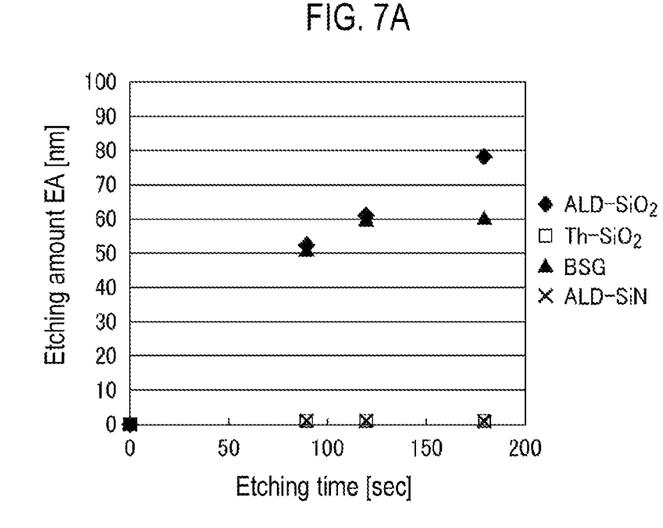
Figure 7B:
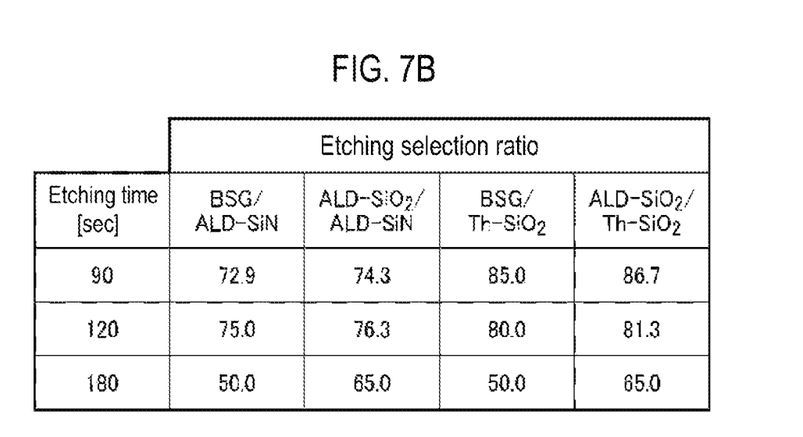

In this experimental example, the etching property of BSG, which is an SiO$_2$ film formed by a CVD method, in addition to an ALD-SiO$_2$ film, an Th—SiO$_2$ film and an ALD-SiN film was confirmed. An etching process was performed by changing the etching time under the conditions where the flow rate ratio of an ethanol gas to the total volume of an HF gas and an ethanol gas was 4.6 volume %, the total gas flow rate of the above mentioned gases fell within a range from 500 to 1000 sccm, a loading table temperature fell within a range from 0 to 15 degrees C. and the internal pressure of the chamber fell within a range from 0.5 to 1.0 Torr, FIG. 7A shows a relationship between the etching time and etching amount in each film at that time, and FIG. 7B shows the etching selection ratio of the ALD-SiO$_2$ film and the BSG with respect to the Th—SiO$_2$ film and the ALD-SiN film. Furthermore, the initial thickness of the BSG was 60 nm and thus the etching amount exceeding 60 nm could not be measured. As shown in FIG. 7A, the Th—SiO$_2$ film and the ALD-SiN film were hardly etched even if the etching time increased, whereas the etching amounts of the ALD-SiO$_2$ film and the BSG were increased as the etching time increased. As shown in FIG. 7B, it was confirmed that the etching selection ratios of the ALD-SiO$_2$ film and the BSG with respect to the Th—SiO$_2$ film and the ALD-SiN film were all extremely high.

Experimental Example 5

In this experimental example, the etching property of a native oxide film existing on the surface of an SiN film was confirmed. An etching process was repeatedly performed to an ALD-SiN film a plurality of times using gases such that the volume ratio of an ethanol gas to the total volume of an HF gas and an ethanol gas, which are the etching gas, was 16.7 volume %, the total flow rate of an N$_2$ gas+an Ar gas fell within a range from 500 to 1,500 sccm, and the total gas flow rate of the above mentioned gases fell within a range from 1,000 to 2,000 sccm, under the conditions where the temperature of the loading table fell within a range of from 0 to 15 degrees C., the internal pressure of the chamber fell within a range from 2.0 to 4.0 Torr and the etching time was 65 sec.

Figure 8:
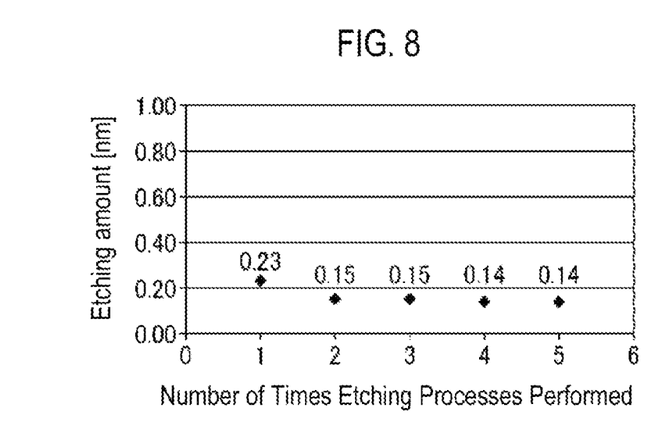
FIG. 8 is a view showing a relationship between the etching amount and the number of times the etching processes are performed to an ALD-SiN film in an experimental example 5.

FIG. 8 shows a relationship between the etching amount and the number of times the etching processes are performed at that time. As shown in FIG. 8, the etching amount of the first etching process was 0.23 nm, whereas the etching amounts of the second etching process and the subsequent processes were stabilized at low values ranging from 0.14 to 0.15 nm. It was thought that this was because an Si native oxide film existing on the surface of the ALD-SiN film was removed at the first etching process. This result represents that, by the gas system in which the ethanol gas was added to the HF gas, the Si native oxide film was rapidly removed and was etched at a high selection ratio with respect to the Th—SiO$_2$ film and the ALD-SiN film.

<Other Applications of the Present Disclosure>

The present disclosure is not limited to the aforementioned embodiments and may be differently modified. For example, the apparatus of the aforementioned embodiments have been presented by way of example only. Indeed, the etching method according to the present disclosure may be implemented by apparatuses having different configurations. Moreover, although an HF gas and an alcohol gas or water vapor are used as a processing gas in the aforementioned embodiments, it may be possible to add an F$_2$ gas as the processing gas. Furthermore, although there is illustrated a case where a semiconductor wafer is used as the process target substrate, the target substrate is not limited to the semiconductor wafer. The target substrate may be other substrates such as a flat panel display (FPD) substrate represented by a liquid crystal display (LCD) substrate, a ceramic substrate, and the like.

According to the present disclosure, a silicon oxide film formed on the surface of the target substrate by a chemical vapor deposition method or an atomic layer deposition method, or a native oxide film formed on the surface of the target substrate can be etched at an extremely high selection ratio with respect to a thermally-oxidized film and a silicon nitride film formed on the surface of the target substrate without generating plasma within the chamber, by supplying an HF gas and an alcohol gas or water vapor into the chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method, comprising:
    disposing a target substrate within a chamber, the target substrate having a first silicon oxide film formed on a surface of the target substrate by a chemical vapor deposition method or an atomic layer deposition method, a second silicon oxide film that includes a thermally-oxidized film and a silicon nitride film, and the second silicon oxide film and the silicon nitride being formed adjacent to the first silicon oxide film; and
    supplying an HF gas and an alcohol gas or water vapor into the chamber to selectively etch the first silicon oxide film with respect to the second silicon oxide film and the silicon nitride film,
    wherein, in the etching, an internal pressure of the chamber is set to fall within a range from 66.7 to 1333.3 Pa, and
    wherein, a volume ratio of the alcohol gas or the water vapor to the total volume of the HF gas+the alcohol gas or the water vapor is set to fall within a range from 3 to 50 volume % when performing the etching.

2. The method of claim 1, further comprising:
    supplying an inert gas into the chamber to perform the etching.

3. The method of claim 1, wherein, in the etching, a temperature of a loading table mounting thereon the target substrate within the chamber is set to fall within a range from 0 to 30 degrees C.

4. The method of claim 1, wherein, the alcohol gas includes at least one selected from a group consisting of ethanol ($C_2H_5OH$), methanol ($CH_3OH$), propanol ($C_3H_7OH$) and butanol ($C_4H_9OH$).

5. A non-transitory storage medium having a program that operates on a computer and controls an etching apparatus stored therein,
   wherein the program, when executed, causes the computer to control the etching apparatus so as to perform the method of claim 1.

6. An etching method, comprising:
   disposing a target substrate within a chamber, the target substrate having a native oxide film formed on a surface of the target substrate, a thermally-oxidized film and a silicon nitride film; and
   supplying an HF gas and an alcohol gas or water vapor into the chamber to selectively etch and remove the native oxide film with respect to the thermally-oxidized film and the silicon nitride film,
wherein, in the etching, an internal pressure of the chamber is set to fall within a range from 66.7 to 1333.3 Pa, and
   wherein, a volume ratio of the alcohol gas or the water vapor to the total volume of the HF gas+the alcohol gas or the water vapor is set to fall within a range from 3 to 50 volume % when performing the etching.

7. The method of claim 6, further comprising:
   supplying an inert gas into the chamber to perform the etching.

8. The method of claim 6, wherein, in the etching, a temperature of a loading table mounting thereon the target substrate within the chamber is set to fall within a range from 0 to 30 degrees C.

9. The method of claim 6, wherein, the alcohol gas includes at least one selected from a group consisting of ethanol ($C_2H_5OH$), methanol ($CH_3OH$), propanol ($C_3H_7OH$) and butanol ($C_4H_9OH$).

10. A non-transitory storage medium having a program that operates on a computer and controls an etching apparatus stored therein,
   wherein the program, when executed, causes the computer to control the etching apparatus so as to perform the method of claim 6.

* * * * *